United States Patent
Schaefer et al.

(10) Patent No.: US 11,928,333 B2
(45) Date of Patent: *Mar. 12, 2024

(54) RESET VERIFICATION IN A MEMORY SYSTEM

(71) Applicant: Micron Technology, Inc., Boise, ID (US)

(72) Inventors: Scott E. Schaefer, Boise, ID (US); Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/946,183

(22) Filed: Sep. 16, 2022

(65) Prior Publication Data
US 2023/0014955 A1    Jan. 19, 2023

Related U.S. Application Data

(63) Continuation of application No. 17/097,766, filed on Nov. 13, 2020, now Pat. No. 11,474,698.
(Continued)

(51) Int. Cl.
*G06F 3/06* (2006.01)
*G11C 7/20* (2006.01)
*G11C 11/4072* (2006.01)

(52) U.S. Cl.
CPC ......... *G06F 3/0604* (2013.01); *G06F 3/0655* (2013.01); *G06F 3/0679* (2013.01); *G11C 7/20* (2013.01); *G11C 11/4072* (2013.01)

(58) Field of Classification Search
CPC .... G06F 3/0604; G06F 3/0655; G06F 3/0679; G06F 3/0605; G06F 3/0634; G06F 3/0632; G11C 7/20; G11C 11/4072; G11C 11/221; G11C 11/2273; G11C 11/2275; G11C 11/2277; G11C 11/2293
See application file for complete search history.

(56) References Cited

U.S. PATENT DOCUMENTS

| 2006/0203576 A1 | 9/2006 | Nishimura et al. |
| 2011/0252191 A1 | 10/2011 | Chang |

(Continued)

FOREIGN PATENT DOCUMENTS

| DE | 102011051188 A1 | 12/2011 |
| WO | 2019/093961 A1 | 5/2019 |

OTHER PUBLICATIONS

International Search Report and Written Opinion received for PCT Patent Application No. PCT/US20/60880, dated Mar. 2, 2021, 8 pages.

*Primary Examiner* — Sultana Begum
(74) *Attorney, Agent, or Firm* — Holland & Hart LLP

(57) ABSTRACT

Methods, systems, and devices for reset verification in a memory system are described. In some examples, a memory device may perform a reset operation and set a mode register to a first value based on performing the reset operation. The first value may be associated with a successful execution of the reset command. The memory device may transmit an indication to a host device based on determining the first value. The host device may determine from the received indication or from the first value stored in the mode register that the first value is associated with the successful execution of the reset command. Thus, the memory device, or the host device, or both may be configured to verify whether the reset operation is successful.

20 Claims, 10 Drawing Sheets

Related U.S. Application Data

(60) Provisional application No. 62/943,722, filed on Dec. 4, 2019.

(56) References Cited

U.S. PATENT DOCUMENTS

| | | |
|---|---|---|
| 2011/0317049 A1 | 12/2011 | Kurane et al. |
| 2014/0149637 A1 | 5/2014 | Gu et al. |
| 2018/0314635 A1 | 11/2018 | Alam |
| 2018/0315466 A1 | 11/2018 | Derner et al. |
| 2019/0237133 A1 | 8/2019 | Oh et al. |

RESET VERIFICATION IN A MEMORY SYSTEM

CROSS REFERENCE

The present application for patent is a continuation of U.S. patent application Ser. No. 17/097,766 by Schaefer et al., entitled "RESET VERIFICATION IN A MEMORY SYSTEM," filed Nov. 13, 2020, which claims priority to U.S. Provisional Patent Application No. 62/943,722 by Schaefer et al., entitled "RESET VERIFICATION IN A MEMORY SYSTEM," filed Dec. 4, 2019, each of which is assigned to the assignee hereof and is expressly incorporated by reference in its entirety.

BACKGROUND

The following relates generally to one or more memory systems and more specifically to reset verification in a memory system.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Some memory devices, such as memory devices that include volatile memory cells, may perform reset operations to reset one or more logic states stored by the memory cells.

DETAILED DESCRIPTION

Figure 1:
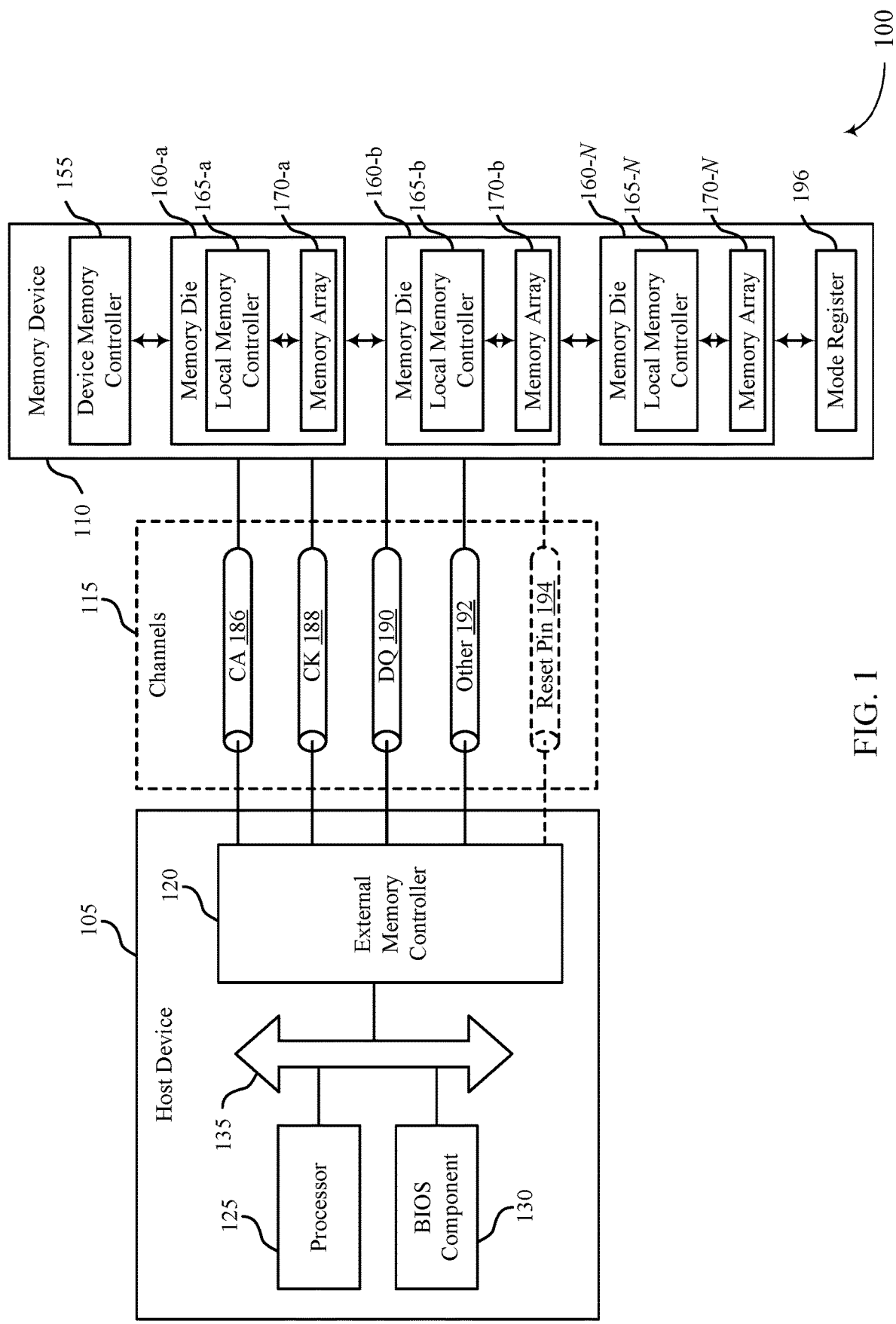
FIG. 1 illustrates an example of a system that supports reset verification in a memory system in accordance with examples as disclosed herein.

A memory system in accordance with examples disclosed herein may include a memory device and a host device coupled with the memory device. Reliability of a memory device in such a system may be based on a statistical probability of failures at the memory device, which may be referred to as a failure in time (FIT), or other terminology. Some applications, such as vehicle safety systems, autonomous vehicle systems, or other safety-critical systems, may have particularly high reliability constraints, or may otherwise be designed for a particularly low probability of failures.

In some memory systems, reliability may be improved when failures are identified, detected, or otherwise handled. For example, if a memory device experiences one hundred failures in a given duration (e.g., a FIT of 100), but all of the errors are handled without operational failure (e.g., where all the errors are handled by an error correction algorithm), the memory device may be associated with a zero FIT (e.g., a zero "Safety FIT") or other measure of relatively high reliability. In other words, a memory device that employs techniques for reducing uncertainties associated with failures, even if such failures occur, may have a favorable reliability compared to a memory device that does not employ such techniques to reduce uncertainty, or otherwise has relatively high uncertainty associated with failures.

In some memory devices, such as those that include memory cells having a degree of volatility, reset operations may be performed by the memory device to periodically reset one or more logic states stored by respective memory cells. For example, a memory device may include one or more memory arrays of memory cells. Periodically, for example, the memory device may perform a reset operation to reset a logic state stored in each of the memory cells of the memory array. Without a method for verifying a reset operation, it may be necessary to assume a given FIT loss or other reliability uncertainty during the reset operation. For example, the memory device may encounter an error during the reset operation and, if the error goes undetected, the reset operation may be associated with a certain FIT loss.

The techniques described herein may improve a reliability in or a reliability rating in a memory system by enabling a memory device to verify and indicate a successful completion of a reset operation. That is, the memory device may verify and indicate (e.g., to a host device) a completion of a reset operation or, in some cases, indicate that there was an error associated with the reset operation. For example, the memory device may transmit an indication to a host device indicating whether reset operation was successful. Additionally or alternatively, the memory device may set a mode register of the memory device to a given value during the reset operation and the host device may determine whether the reset operation was successful by reading the mode register and determining whether the mode register is storing the given value. By indicating whether a reset operation is successful, the memory device may decrease an uncertainty associated with the reset operation, thus increasing the reliability or reliability rating of the memory system including the memory device and advantageously allowing the host device or other components to perform additional operations given the success of the reset operation.

Features of the disclosure are initially described in the context of memory systems and dies as described with reference to FIGS. 1 and 2. Features of the disclosure are described in the context of a timing diagram as described with reference to FIG. 3. These and other features of the disclosure are further illustrated by and described with reference to an apparatus diagram and flowcharts that relate to reset verification in a memory system as described with references to FIGS. 6-10.

FIG. 1 illustrates an example of a system 100 that supports reset verification in a memory system in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a reset command for a reset operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105, or a read command indicating that the memory device 110 is to provide data stored in a memory die 160 to the host device 105, or a reset command indicating that the memory device 110 is to reset one or more logic states stored at the memory device.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The memory arrays 170 of the memory device 110 may include memory cells having a degree of volatility and reset operations may be performed by the memory device 110 to reset one or more logic states stored by one or more respective memory cells. In some examples, a reset operation may be performed at the memory device 110 after powering on the memory device 110. Additionally or alternatively, a reset operation may be performed at the memory device 110 based on receiving a command from the host device 105. For example, the host device may signal the reset operation by driving a reset signal to a different state (e.g., a relatively low state). For example, the memory device may begin performing the reset operation while the reset signal is in the different state (e.g., a low state) and may stop performing the reset operation when the reset signal is in another state (e.g., a relatively high state).

In accordance with examples as disclosed herein, the memory device 110 may be configured to indicate whether a reset operation is successful. That is, the memory device 110 may determine (e.g., verify) whether a reset operation was successful and may indicate to a host device 105 a successful completion of a reset operation or, alternatively, an indication of an error associated with the reset operation. In some instances, if there is an error associated with the reset operation, a state of the memory device 110 may be unknown (e.g., unpredictable). By indicating whether a reset operation is successful, the memory device 110 may decrease an uncertainty associated with the reset operation, thus increasing the reliability or reliability rating of the system 100 including the memory device 110.

In some examples, the memory device 110 may determine (e.g., verify) whether a reset operation was successful and may transmit, to the host device 105, an indication of whether a reset operation is successful. Here, the memory device 110 may transmit the indication to the host device 105 by a multi-use channel 115 such as a CA channel 186, a CK channel 188, a DQ channel 190, or another channel 192, among other examples. In this example, the memory device 110 may transmit the indication to the host device by the multi-use channel 115 during a defined unit interval.

Alternatively, the memory device 110 may transmit the indication to the host device 105 by a dedicated channel 115 such as by transmitting to the host device 105 using a reset pin 194. The reset pin 194 may be a pin dedicated to transmitting an indication from the memory device 110 to the host device 105 indicating whether a reset operation is successful. In another example, the memory device may set a mode register 196 to a given value during an execution of a reset operation. That is, if the memory device 110 successfully completes a reset operation, the memory device 110 may program the mode register 196 to the given value (e.g., a value known to the memory device 110 and the host device 105). Here, the host device 105 may read the mode register 196 to determine whether the reset operation was successful. If the reset operation is successful, the host device may determine (e.g., based on performing the read operation) that the mode register 196 is storing the given value. Alternatively, if the reset operation is associated with an error, the host device 105 may determine that the mode register 196 is storing a value different than the given value.

Figure 2:
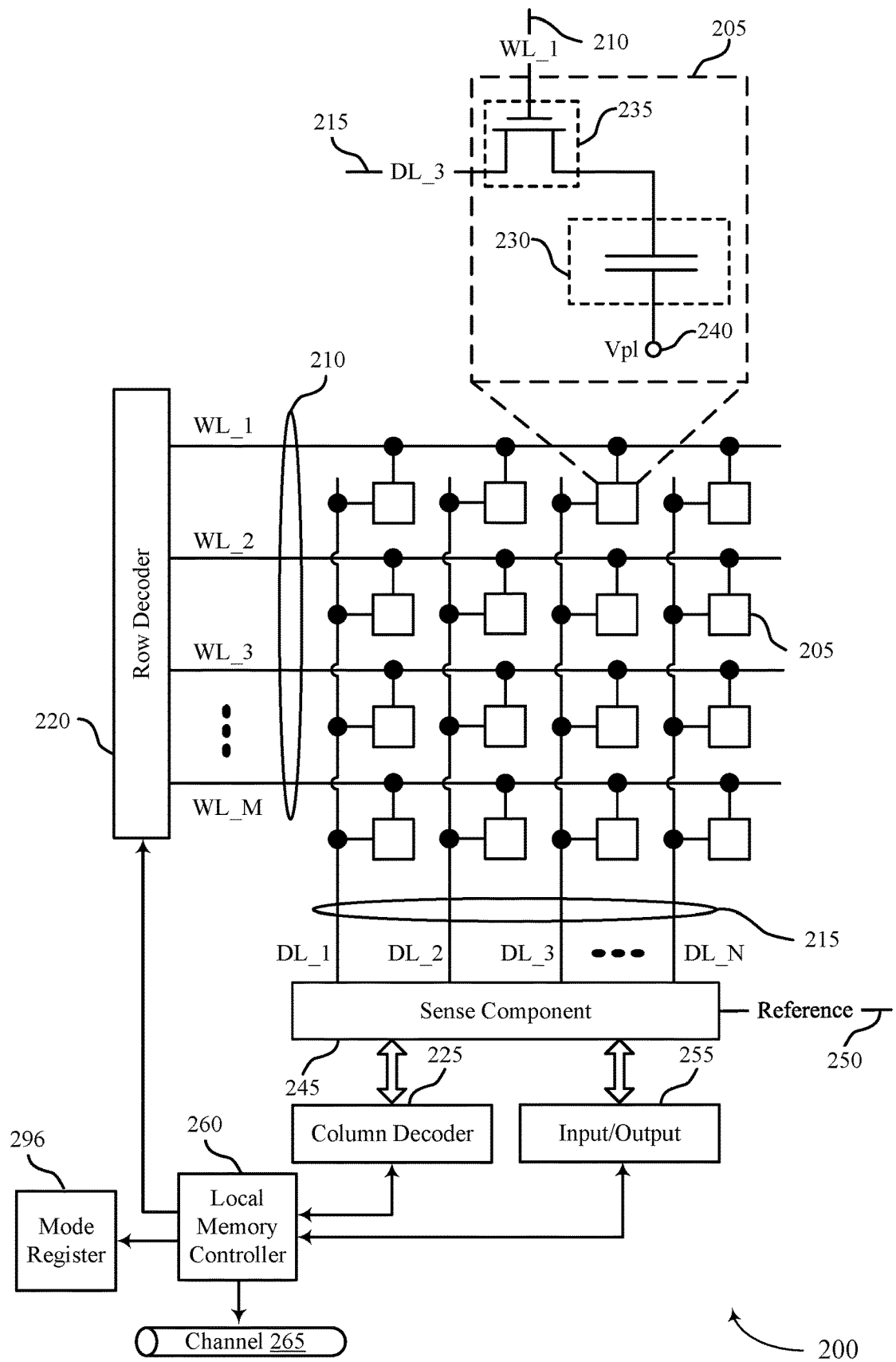
FIG. 2 illustrates an example of a memory die that supports reset verification in a memory system in accordance with examples as disclosed herein.

FIG. 2 illustrates an example of a memory die 200 that supports reset verification in a memory system in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be operable to couple and/or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

The local memory controller 260 may be operable to perform a reset operation on one or more memory cells 205 of the memory die 200. During a reset operation, the logic state stored in a memory cell 205 of the memory die 200 may be set to a logic value associated with a reset state. For example, the memory cells 205 of the memory die 200 may be set to a logic value '0.' Such a reset operation may be performed based on supplying an initial power to the memory die 200 (e.g., powering on a memory device including the memory die 200). In another example, the reset operation may be performed based on receiving a command (e.g., from a host device) to perform the reset operation.

The memory die 200 may be configured to indicate whether a reset operation is successful. That is, the memory die 200 may indicate (e.g., to a host device) a successful completion of a reset operation or, alternatively, an indication of an error associated with the reset operation. By indicating whether a reset operation is successful, the memory die 200 may decrease an uncertainty associated with the reset operation, thus increasing the reliability or reliability rating of a memory system including the memory die 200.

In some examples, the local memory controller 260 may initiate a reset operation at the memory die 200. After a completion of the reset operation, the local memory controller 260 may transmit an indication of whether the reset operation was successful by channel 265, which may be an example of a channel 115 as described with reference to FIG. 1. The channel 265 may be a multi-use channel 265 (e.g., a CA channel, a CK channel, a DQ channel, or another channel) or a dedicated channel 265 (e.g., a channel 265 dedicated to indicating whether a reset operation is successful). In some examples, the local memory controller 260 may set a mode register 296 to a given value during an execution of the reset operation. Here, a host device may read the mode register 296 to determine whether the reset operation was successful. If the reset operation is successful, the mode register 196 may be storing the given value. Alternatively, if the reset operation is associated with an error, the mode register 296 may be storing a value different than the given value.

Figure 3:
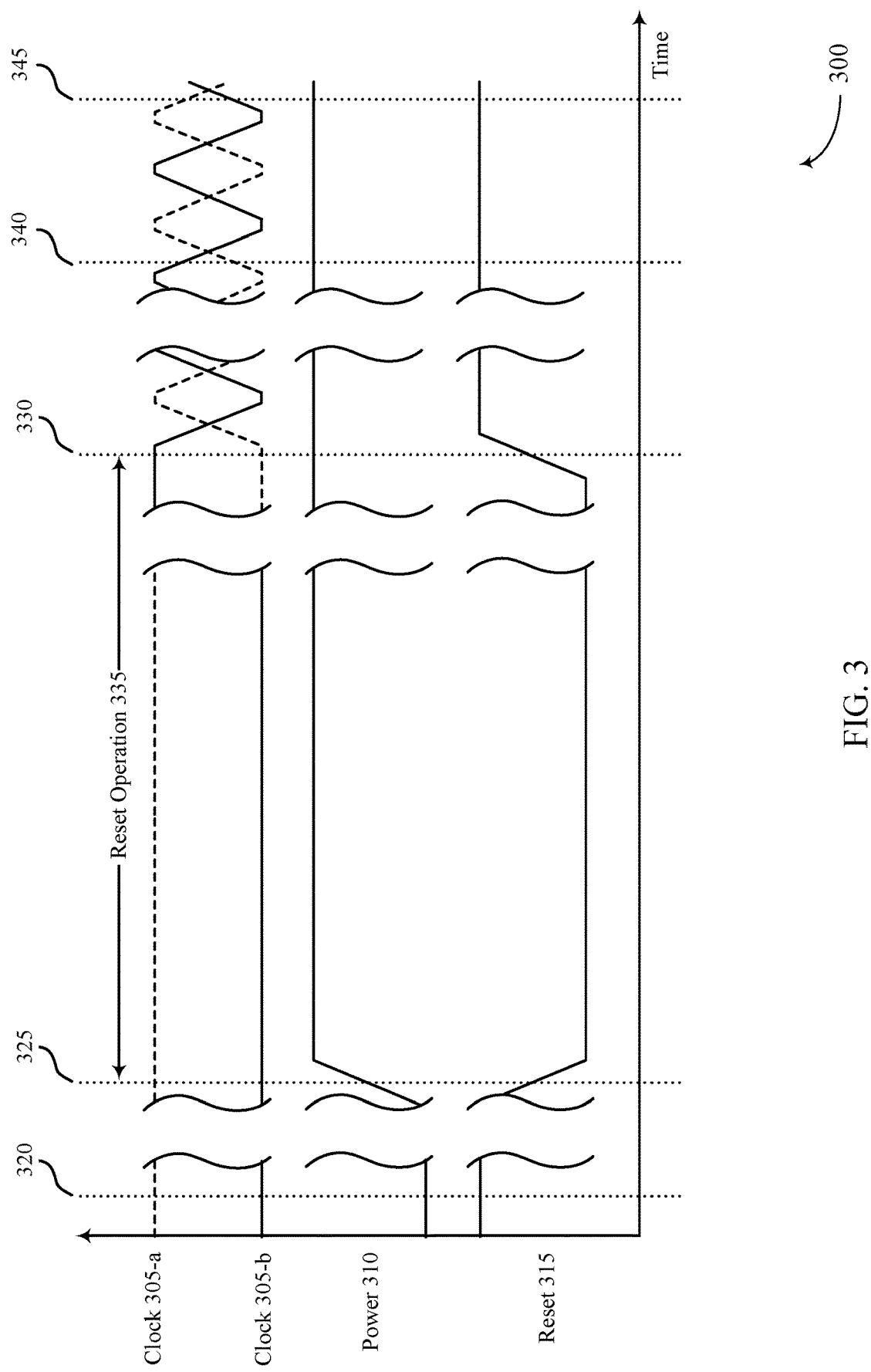
FIG. 3 illustrates an example of a timing diagram that supports reset verification in a memory system in accordance with examples as disclosed herein.

FIG. 3 illustrates an example of a timing diagram 300 that supports reset verification in a memory system in accordance with examples as disclosed herein. The timing diagram 300 may illustrate a timing of a reset operation 335 performed at a memory device 110 or a memory die 200 as described with reference to FIGS. 1 and 2. The timing diagram 300 may illustrate clock signals 305, a power supply voltage 310, and a reset signal 315.

At 320, the memory device may be powered on. In some cases, before 320, the memory device may be in a powered off state or a lower power level state relative to after 320. Here, from 320 to 325, a power supply voltage 310 may ramp up to or above a desired power supply voltage level. Alternatively, at 320 the memory device may have been powered on for a period of time. Here, the power supply voltage 310 may already be at or above the desired power supply voltage level.

At 325, the memory device may begin executing a reset operation 335 by maintaining the reset signal 315 in a low state (e.g., a state that is below a threshold). In some cases, the memory device may begin executing the reset operation 335 based on performing an initialization sequence that occurs after the memory device is initially powered on. Additionally or alternatively, the memory device begin executing the reset operation 335 based on receiving a reset command from a host device. For example, the host device may drive the reset signal 315 from a first state to a second state, such as the high state to the low state, thus initializing the reset operation 335. In some cases, the host device may drive the reset signal 315 to the low state to initiate the reset operation 335. Additionally or alternatively, the host device may drive the reset signal 315 to the low state due to a noise spike or a glitch signal, among other conditions. Here, the memory device may begin executing the reset operation 335 and the host device may not be aware of the reset operation 335. If the host device drives the reset signal 315 to a higher state (e.g., after the noise spike or glitch signal for example), the memory device may exit the reset operation 335 before completing the execution of the reset operation 335, resulting in an error of the reset operation 335.

During an execution of the reset operation 335, the memory device may reset at least some if not each of the memory cells (e.g., within a single memory array, within multiple memory arrays). For example, the memory device may set memory cells to logic state '0' during a reset operation 335. The clock signals 305 may not be started during the reset operation 335. For example, the clock signal 305-*a* may be maintained at a high voltage while the clock signal 305-*b* may be maintained at a low voltage.

At 330, the memory device may exit the reset operation 335 by driving the reset signal 315 to a high state. Additionally, the memory device may initialize the clock signals 305-*a* and 305-*b*. The memory device may monitor one or more components or signals within the memory device to detect the completion (e.g., the exit) of the reset operation 335 at 330. That is, circuitry at the memory device may monitor the clock signals 305, the reset signal 315, or portions of the memory device (e.g., certain memory cells, access line voltages) to detect signals or signal changes associated with a completion of the reset operation 335.

For example, the circuitry may monitor the clock signal 305-*a*, the clock signal 305-*b*, or both. Here, the circuitry may detect one or both of the clock signals 305 starting at 330 after a completion of the reset operation 335. The circuitry may indicate (e.g., to a local controller, to a device memory controller) the start of the clock signals 305. The memory device may determine, based on the starting of at least one of the clock signals 305, that the reset operation 335 is complete. Thus, the memory device may determine that an exit error did not occur during the execution of the reset operation 335. Alternatively, if the circuitry does not detect the starting of at least one of the clock signals 305 at 330, the circuitry may detect that an error did occur during the execution of the reset operation 335.

In another example, the circuitry may monitor the reset signal 315. Here, the circuitry may detect that the reset signal 315 transitions from a lower voltage (e.g., during an execution of the reset operation 335) to a higher voltage (e.g., upon a completion of the execution of the reset operation 335) that is above a threshold. The circuitry may indicate to a controller of the memory device, that the reset signal 315 switched from the lower voltage to the higher voltage. The controller may determine, based on the reset signal 315 switching from the lower voltage to the higher voltage, that the reset operation 335 is complete. Alternatively, if the circuitry does not detect the reset signal 315 going from the lower voltage to the higher voltage at 330, the circuitry may indicate to the controller that the reset signal 315 did not switch. Here, the controller may determine that an error occurred during an execution of the reset operation 335.

In some examples, the circuitry may monitor one or more memory cells to detect when the one or more memory cells is reset, indicating a completion (or near completion) of the reset operation 335. Additionally or alternatively, the circuitry may monitor one or more access lines to determine when a reset operation 335 has occurred (e.g., at a given portion of the memory device). For example, the circuitry may monitor one or more access lines associated with a set of memory cells reset at an end of the execution of the reset operation 335. Here, the circuitry may indicate to the controller of the memory device that the access lines were driven to a higher voltage (e.g., associated with the reset operation 335 occurring at the set of memory cells). Thus, the controller may determine that the reset operation 335 is complete after at least some if not all of these memory cells are reset. Alternatively, if the circuitry fails to detect the access lines being driven according to the execution of the reset operation 335, the circuitry may indicate the failure to the controller. Here, the controller may determine that an error occurred during an execution of the reset operation 335.

If the circuitry fails to detect the completion of the reset operation 335, the circuitry may indicate a failure to a host device. For example, the circuitry may set a mode register of the memory device to a value associated with a reset error. In another example, the circuitry may communicate a flag to the host device, such as, by using a pin. In some cases, the pin may be a dedicated pin (e.g., for indicating whether the reset operation 335 is successful). Additionally or alternatively, the pin may be a multi-use pin (e.g., associated with a CA channel, a CK channel, a DQ channel, or another channel). Thus, the memory device may indicate to the host device that the reset operation failed to exit normally. By indicating a failure of the reset operation to the host device, the memory device may indicate the uncertain state of the memory device to the host device even in a case that the host device is unaware of the reset operation 335. For example, if the host device drives the reset signal 315 low unintentionally (e.g., due to noise, due to a glitch), the host device may still receive an indication of an error associated with the reset operation 335. This may reduce an uncertainty associated with an operation of the memory device.

At 340, the memory device may indicate whether the reset operation 335 is successful by a reset confirmation 340. That is, between 330 and 340, the memory device may determine whether the reset operation 335 was successful and at 340, the memory device may indicate the success (or error) of the reset operation 335. A time between 330 and 340 may be greater than or equal to a threshold time delay. That is, the memory device may indicate whether the reset operation 335 is successful at a time after 330 that is greater than or equal to the threshold time delay. The memory device may track an amount of time associated with the time delay (e.g., a time buffer) and indicate whether the reset operation 335 is successful after the amount of time has passed since 330. The memory device may track the amount of time using a timer, or by the clock signals 305, or some other method, or any combination thereof.

The memory device may indicate the success of the reset operation 335 based on a mode register storing a value (e.g., a first value) indicating the success of the reset operation 335. The value may be predefined or otherwise known by the memory device and a host device. During a normal operation of the memory device, the mode register may be configured to store a value (e.g., a second value). During the execution of the reset operation 335 (or, in some cases, after an execution of the reset operation 335), the memory device may program the mode register to the first value. Thus, a successful completion of the reset operation 335 may be indicated by the mode register storing the first value. Additionally, if an error occurred during the execution of the reset operation 335, the mode register may store a value different than the first value (e.g., the second value). In some cases, the first value may correspond to each bit of the mode register storing a logic value '0' or, alternatively, a logic value '1.' In some examples, the first value may correspond to memory device may set each bit of the mode register to a logic value '1' to indicate the completion of the reset operation 335. In some examples, the first logic value may be some other defined value. In some cases, if the memory detects an error associated with the reset operation 335, the memory device may set the mode register to the second value (or, in some cases, maintain the mode register at the second value). Alternatively, the memory device may set the mode register to a third value indicating the error.

The mode register to be programmed to store the first value may be predefined. For example, the memory device and host device may be preconfigured to determine that a given mode register, such as a third mode register (e.g., MRx3[op7]), may be programmed to store the first value upon the completion of the reset operation 335. In another example, the memory device may indicate which mode register (e.g., from a set of mode registers at the memory device) is to be programmed to store the first value after a completion of a reset operation 335. That is, the memory device may transmit an indication to the host device indicating the mode register.

The host device may read the mode register to determine whether the reset operation 335 was successful. In some instances, the host device may periodically request (e.g., poll) or read information from the mode register by transmitting read commands for the mode register according to a given cadence (e.g., a periodicity, an aperiodic schedule, based on one or more conditions).

In some examples, the memory device may indicate, to the host device, a completion of the reset operation 335. Here, the host device may read the mode register based on receiving the indication. To read the mode register, the host device may transmit a read command for the mode register to the memory device. The memory device may communicate the value stored in the mode register to the host device based on receiving the read command.

In some examples, the host device (or another device or component) may compare the value stored in the mode register to the second value to determine if the value stored in the mode register is different than the second value. If the host device determines that the mode register is storing the first value (or a value different than the second value), the host device may determine that the reset operation 335 was successful. Alternatively, if the host device determines that the mode register is storing a value different than the first value, the host device may determine that the reset operation 335 was not successful (e.g., is associated with an error).

In some examples, the memory device may indicate the success of the reset operation 335 by transmitting an indication to the host device. In some cases, the memory device may program a mode register, or transmit the indication, or both. For example, the memory device may indicate to the host device to read the mode register. Additionally or alternatively, the memory device may indicate the value (e.g., of the mode register) to the host device. In some examples, the memory device may transmit the indication instead of programming the mode register. Here, the indication may indicate a success or a failure of the reset operation 335.

The memory device may transmit the indication after the time delay (e.g., between 330 and 340). The time delay may be defined, based on a processing speed of the memory device, or both. The memory device may transmit the indication by a channel (e.g., a pin) between the memory device and the host device. The channel may include a pin dedicated to transmitting the indication (e.g., a reset pin). In some examples, the channel may include a pin that communicates other information as well. For example, the pin may be a multi-use pin. Here, there may be a unit interval defined during which the memory device can transmit the indication of whether the reset operation 335 was successful. For example, the unit interval may be defined to occur after the time delay (e.g., between 330 and 340) has transpired.

At 345, the memory device may begin operating in a first operating mode (e.g., a normal operating mode). For example, the memory device may begin receiving access commands from a host device and executing the access commands accordingly. That is, the memory device may perform read operations, write operations, refresh operations, or other operations (or any combination thereof) associated with a typical operation of the memory device.

In some instances, one or more mode registers of the memory device may be programmed to values associated with the first operating mode before 345. For example, if the memory device programs a mode register to the first value to indicate a completion of the reset operation 335, the mode register may be programmed to a different value (e.g., a second value) associated with the first operating mode before the memory device receiving and executing access commands in accordance with the first operating mode. The memory device may autonomously determine to reprogram the one or more mode registers to the values associated with the first operating mode. Alternatively, the memory device may receive a write command from a host device indicating the value associated with the first operating mode. The memory device may program the mode register to store the indicated value based during an execution of the write command.

Figure 4:
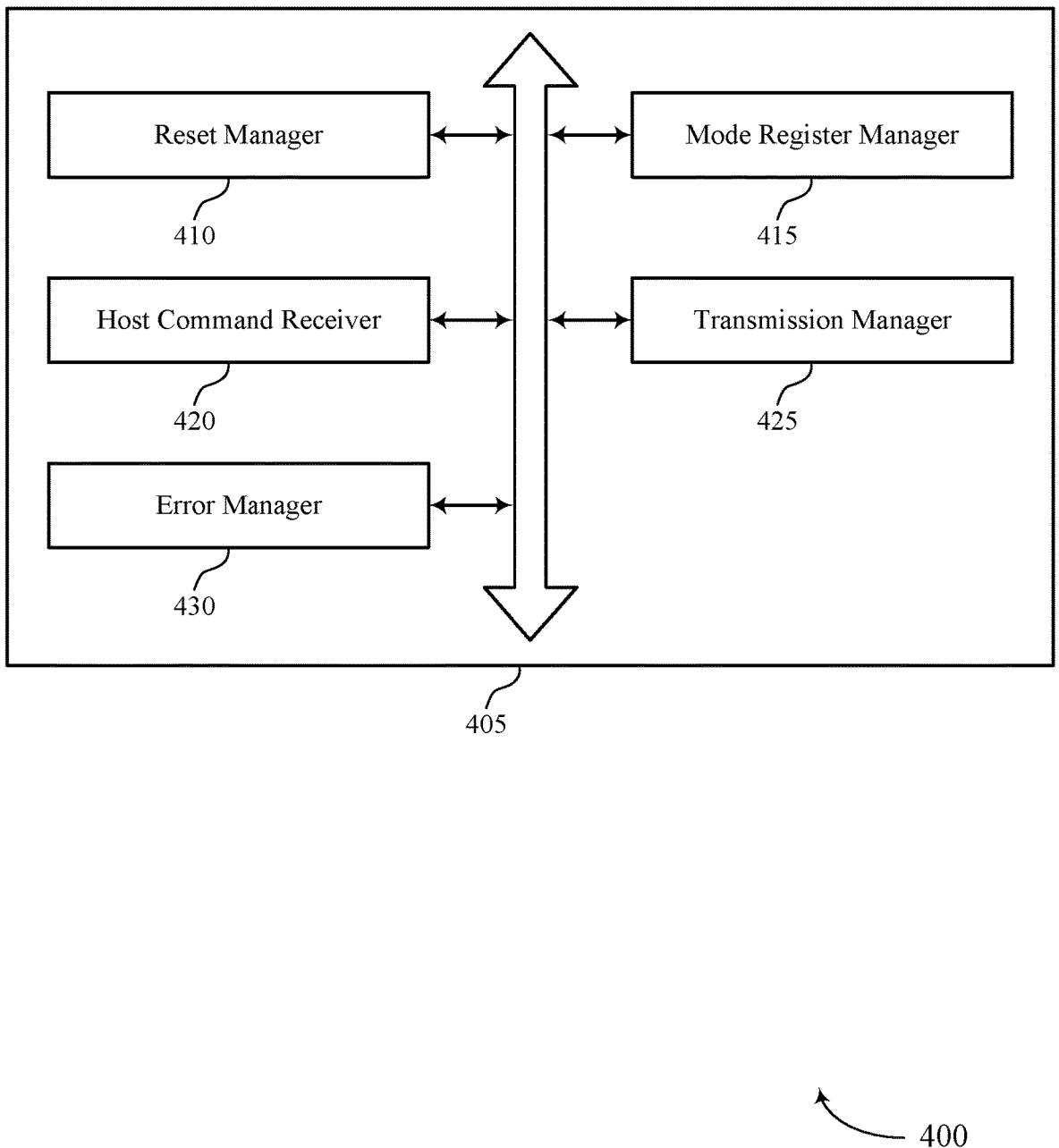
FIG. 4 shows a block diagram of a memory device that supports reset verification in a memory system in accordance with aspects of the present disclosure.

FIG. 4 shows a block diagram 400 of a memory device 405 that supports reset verification in a memory system in accordance with examples as disclosed herein. The memory device 405 may be an example of aspects of a memory device as described with reference to FIGS. 1 through 3. The memory device 405 may include a reset manager 410, a mode register manager 415, a host command receiver 420, a transmission manager 425, and an error manager 430. Each of these modules may communicate, directly or indirectly, with one another (e.g., via one or more buses).

The reset manager 410 may perform a reset operation at a memory device. In some examples, the reset manager 410 may perform a second reset operation at the memory device.

The mode register manager 415 may set a mode register to a first value based on performing the reset operation, the first value associated with successfully executing the reset operation. In some examples, the mode register manager 415 may set the mode register to a second value after transmitting the indication to the host device, the second value associated with a second operation mode of the memory device that is different than a first operation mode of the memory device associated with performing the reset operation. In some cases, the second operation mode of the memory device is associated with performing a read operation, or a write operation, or both. In some instances, each bit of the first value includes a logic value '0.' Alternatively, each bit of the first value may include a logic value '1.' In some cases, each bit of the first value corresponds to a value that is predefined.

The transmission manager 425 may transmit, to a host device after setting the mode register to the first value, an indication that is based on the first value. In some examples, the transmission manager 425 may transmit, to the host device, the first value to the host device based on receiving the read command. In some instances, the transmission manager 425 may transmit, to the host device, the first value stored in the mode register based on receiving one read command of the set of read commands, where transmitting the indication is based on transmitting the first value. In some cases, the transmission manager 425 may transmit, to the host device after detecting the error, a second indication that is based on detecting the error associated with the second reset operation.

In some examples, the transmission manager 425 may transmit the indication to the host device by a pin that is dedicated to transmitting indications associated with performing reset operations. In some instances, an amount of time between successfully executing the reset operation and transmitting the indication to the host device is greater than or equal to a time delay defined for performing the reset operation. In some cases, the indication indicates a completion of performing the reset operation at the memory device. In some examples, the indication includes the first value.

The host command receiver 420 may receive, from the host device, a command to set the mode register to the second value, where setting the mode register to the second value is based on receiving the command from the host device. In some examples, the host command receiver 420 may receive, from the host device, a read command for the mode register based on transmitting the indication. In some cases, the host command receiver 420 may receive, from the host device, a set of read commands for the mode register according to a periodicity. In some examples, the transmission manager 425 may transmit a second value stored at the mode register based on receiving the read command, where the second value is different than the first value and indicates the error associated with the second reset operation. In some examples, the host command receiver 420 may receive, from the host device, a command to perform the reset operation at the memory device, where performing the reset operation is based on receiving the command.

The error manager 430 may detect, by the memory device, an error associated with the second reset operation.

Figure 5:
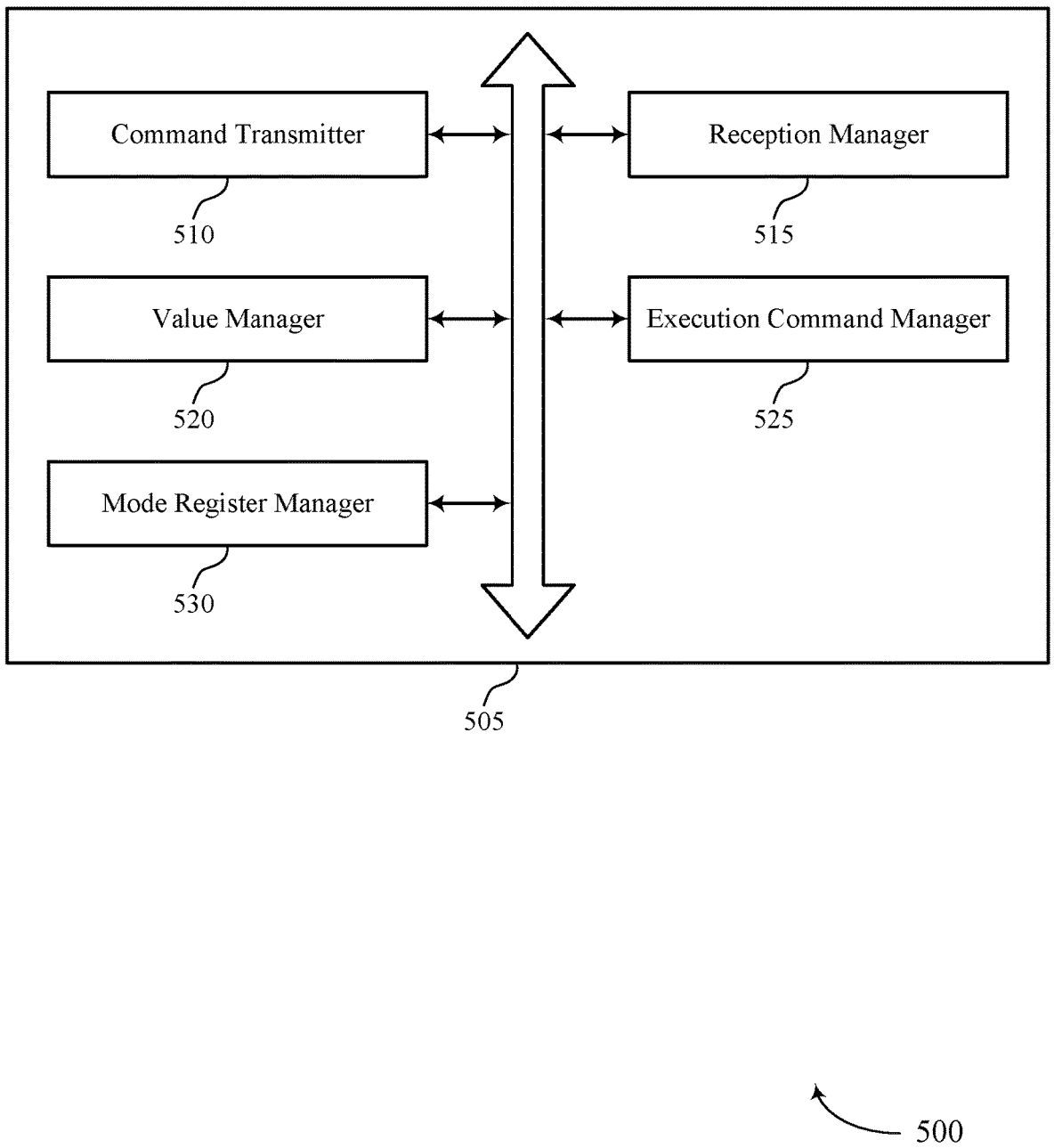
FIG. 5 shows a block diagram of a host device that supports reset verification in a memory system in accordance with aspects of the present disclosure.

FIG. 5 shows a block diagram 500 of a host device 505 that supports reset verification in a memory system in accordance with examples as disclosed herein. The host device 505 may be an example of aspects of a host device as described with reference to FIGS. 1 through 3. The host device 505 may include a command transmitter 510, a reception manager 515, a value manager 520, an execution command manager 525, and a mode register manager 530. Each of these modules may communicate, directly or indirectly, with one another (e.g., via one or more buses).

The command transmitter 510 may transmit, to a memory device, a reset command. In some examples, the command transmitter 510 may transmit, to the memory device, a read command for the mode register based on the completion of performing the reset operation at the memory device. In some cases, the command transmitter 510 may transmit, to the memory device, a command to set the mode register to the second value after determining that the execution of the reset command was successful. In some instances, the command transmitter 510 may transmit a second reset command to the memory device.

The reception manager 515 may receive, from the memory device based on transmitting the reset command, an indication associated with a mode register of the memory device storing a first value. In some cases, the indication includes the first value. In some examples, the reception manager 515 may receive the first value from the memory device based on transmitting the read command, where determining the first value is based on receiving the first value from the memory device. In some instances, the reception manager 515 may receive, from the memory device, a second indication based on transmitting the second reset command, the second indication associated with the mode register of the memory device storing a second value.

The value manager 520 may determine the first value based on receiving the indication. In some examples, the value manager 520 may compare the first value with a second value indicating a second operation mode of the memory device different than a first operation mode of the memory device associated with executing the reset command. In some examples, the value manager 520 may determine that the first value is associated with the first operation mode and is different than the second value based on the comparing, where determining that the execution of the reset command was successful is based on determining that the first value and the second value are different. In some examples, the value manager 520 may determine the first value based on the indication including the first value. In some cases, the value manager 520 may determine that the second value is different than the first value based on receiving the second indication, the first value associated with a first operation mode of the memory device associated with executing the second reset command.

The execution command manager 525 may determine that an execution of the reset command was successful based on determining the first value. In some examples, the execution command manager 525 may determine that an execution of the second reset command was unsuccessful based on determining that the second value is different than the first value.

The mode register manager 530 may determine the mode register from a set of mode registers based on receiving the indication, where determining the first value is based on determining the mode register.

Figure 6:
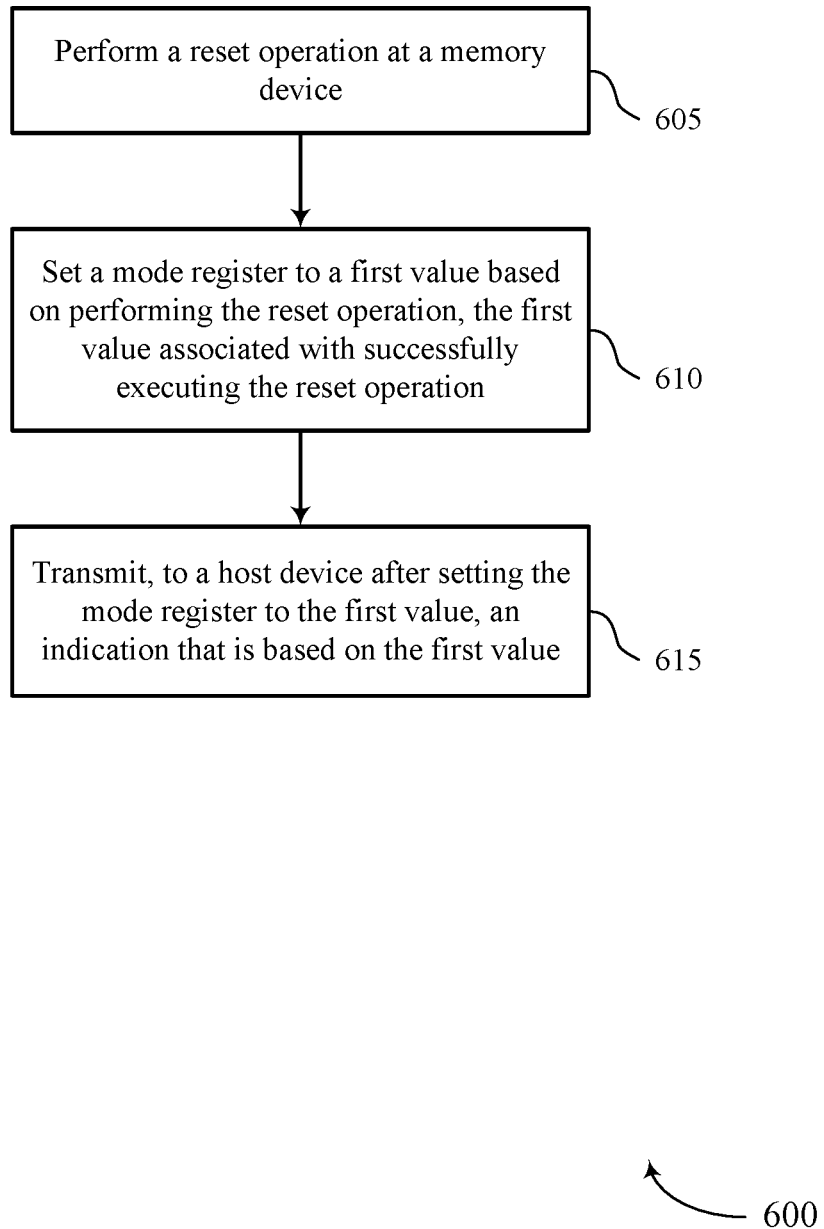
FIGS. 6 through 10 show flowcharts illustrating a method or methods that support reset verification in a memory system in accordance with examples as disclosed herein.

FIG. 6 shows a flowchart illustrating a method or methods 600 that supports reset verification in a memory system in accordance with aspects of the present disclosure. The operations of method 600 may be implemented by a memory device or its components as described herein. For example, the operations of method 600 may be performed by a memory device as described with reference to FIG. 4. In some examples, a memory device may execute a set of instructions to control the functional elements of the memory device to perform the described functions. Additionally or alternatively, a memory device may perform aspects of the described functions using special-purpose hardware.

At 605, the memory device may perform a reset operation at a memory device. The operations of 605 may be performed according to the methods described herein. In some examples, aspects of the operations of 605 may be performed by a reset manager as described with reference to FIG. 4.

At 610, the memory device may set a mode register to a first value based on performing the reset operation, the first value associated with successfully executing the reset operation. The operations of 610 may be performed according to the methods described herein. In some examples, aspects of the operations of 610 may be performed by a mode register manager as described with reference to FIG. 4.

At 615, the memory device may transmit, to a host device after setting the mode register to the first value, an indication that is based on the first value. The operations of 615 may be performed according to the methods described herein. In some examples, aspects of the operations of 615 may be performed by a transmission manager as described with reference to FIG. 4.

In some examples, an apparatus as described herein may perform a method or methods, such as the method 600. The apparatus may include features, means, or instructions (e.g., a non-transitory computer-readable medium storing instructions executable by a processor) for performing a reset operation at a memory device, setting a mode register to a first value based on performing the reset operation, the first value associated with successfully executing the reset operation, and transmitting, to a host device after setting the mode register to the first value, an indication that is based on the first value.

Some cases of the method 600 and the apparatus described herein may further include operations, features, means, or instructions for setting the mode register to a second value after transmitting the indication to the host device, the second value associated with a second operation mode of the memory device that may be different than a first operation mode of the memory device associated with performing the reset operation.

Some instances of the method 600 and the apparatus described herein may further include operations, features, means, or instructions for receiving, from the host device, a command to set the mode register to the second value, where setting the mode register to the second value may be based on receiving the command from the host device.

In some examples of the method 600 and the apparatus described herein, the second operation mode of the memory device may be associated with performing a read operation, or a write operation, or both.

Some cases of the method 600 and the apparatus described herein may further include operations, features, means, or instructions for receiving, from the host device, a read command for the mode register based on transmitting the indication, and transmitting, to the host device, the first value to the host device based on receiving the read command.

Some instances of the method 600 and the apparatus described herein may further include operations, features, means, or instructions for receiving, from the host device, a set of read commands for the mode register according to a periodicity, and transmitting, to the host device, the first value stored in the mode register based on receiving one read command of the set of read commands, where transmitting the indication may be based on transmitting the first value.

In some examples of the method 600 and the apparatus described herein, an amount of time between successfully executing the reset operation and transmitting the indication to the host device may be greater than or equal to a time delay defined for performing the reset operation.

Some cases of the method 600 and the apparatus described herein may further include operations, features, means, or instructions for receiving, from the host device, a command to perform the reset operation at the memory device, where performing the reset operation may be based on receiving the command.

Some instances of the method 600 and the apparatus described herein may further include operations, features, means, or instructions for performing a second reset operation at the memory device, detecting, by the memory device, an error associated with the second reset operation, and transmitting, to the host device after detecting the error, a second indication that may be based on detecting the error associated with the second reset operation.

Some examples of the method 600 and the apparatus described herein may further include operations, features, means, or instructions for receiving, from the host device, a read command for the mode register based on transmitting the indication, and transmitting a second value stored at the mode register based on receiving the read command, where the second value may be different than the first value and indicates the error associated with the second reset operation.

Some cases of the method 600 and the apparatus described herein may further include operations, features, means, or instructions for transmitting the indication to the host device by a pin that may be dedicated to transmitting indications associated with performing reset operations.

In some instances of the method 600 and the apparatus described herein, each bit of the first value includes a logic value '0', each bit of the first value includes a logic value '1'; or, and each bit of the first value corresponds to a value that may be predefined.

In some examples of the method 600 and the apparatus described herein, the indication indicates a completion of performing the reset operation at the memory device.

In some cases of the method 600 and the apparatus described herein, the indication includes the first value.

Figure 7:
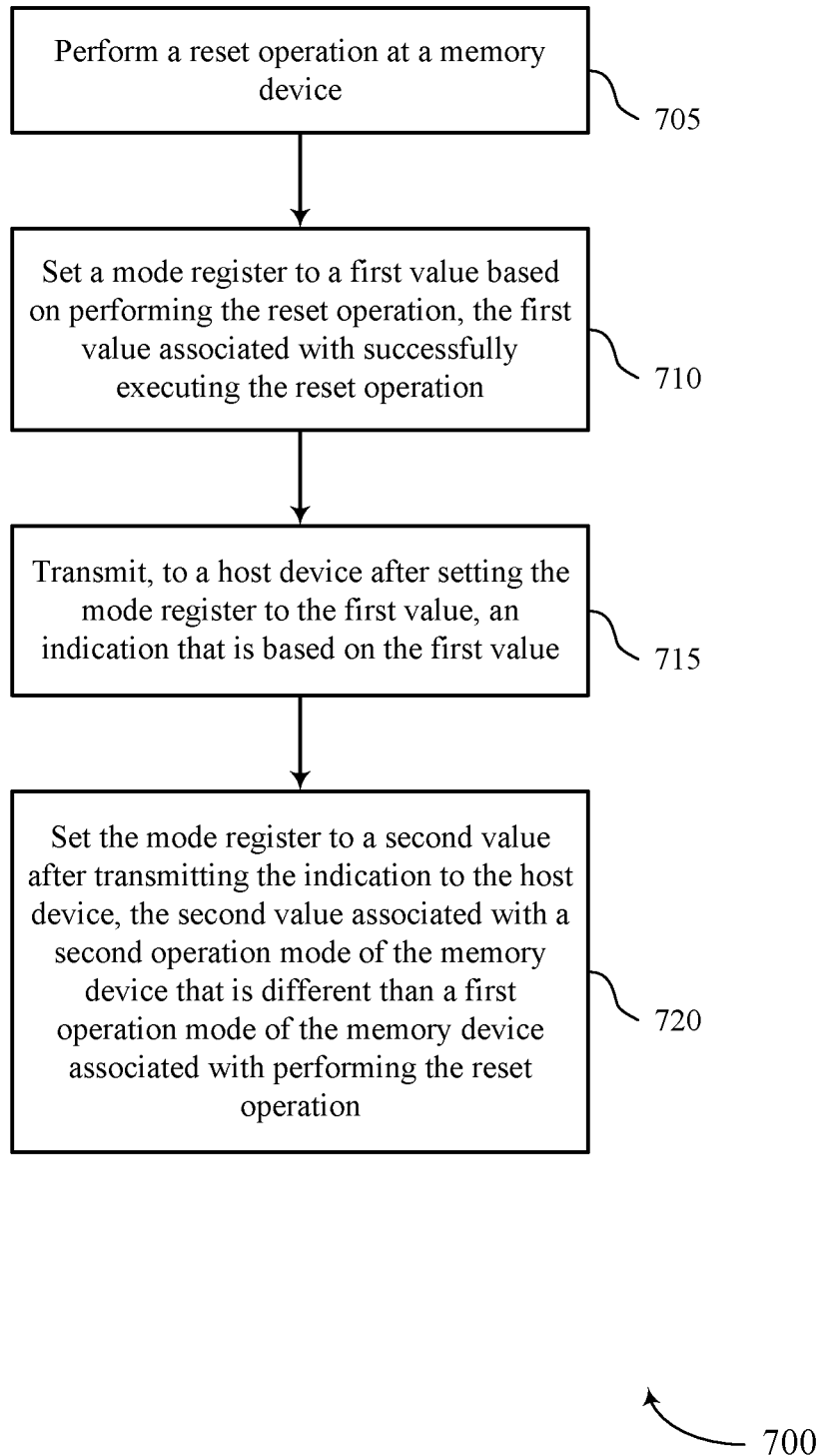

FIG. 7 shows a flowchart illustrating a method or methods 700 that supports reset verification in a memory system in accordance with aspects of the present disclosure. The operations of method 700 may be implemented by a memory device or its components as described herein. For example, the operations of method 700 may be performed by a memory device as described with reference to FIG. 4. In some examples, a memory device may execute a set of instructions to control the functional elements of the memory device to perform the described functions. Additionally or alternatively, a memory device may perform aspects of the described functions using special-purpose hardware.

At 705, the memory device may perform a reset operation at a memory device. The operations of 705 may be performed according to the methods described herein. In some examples, aspects of the operations of 705 may be performed by a reset manager as described with reference to FIG. 4.

At 710, the memory device may set a mode register to a first value based on performing the reset operation, the first value associated with successfully executing the reset operation. The operations of 710 may be performed according to the methods described herein. In some examples, aspects of the operations of 710 may be performed by a mode register manager as described with reference to FIG. 4.

At 715, the memory device may transmit, to a host device after setting the mode register to the first value, an indication that is based on the first value. The operations of 715 may be performed according to the methods described herein. In some examples, aspects of the operations of 715 may be performed by a transmission manager as described with reference to FIG. 4.

At 720, the memory device may set the mode register to a second value after transmitting the indication to the host device, the second value associated with a second operation mode of the memory device that is different than a first operation mode of the memory device associated with performing the reset operation. The operations of 720 may be performed according to the methods described herein. In some examples, aspects of the operations of 720 may be performed by a mode register manager as described with reference to FIG. 4.

Figure 8:
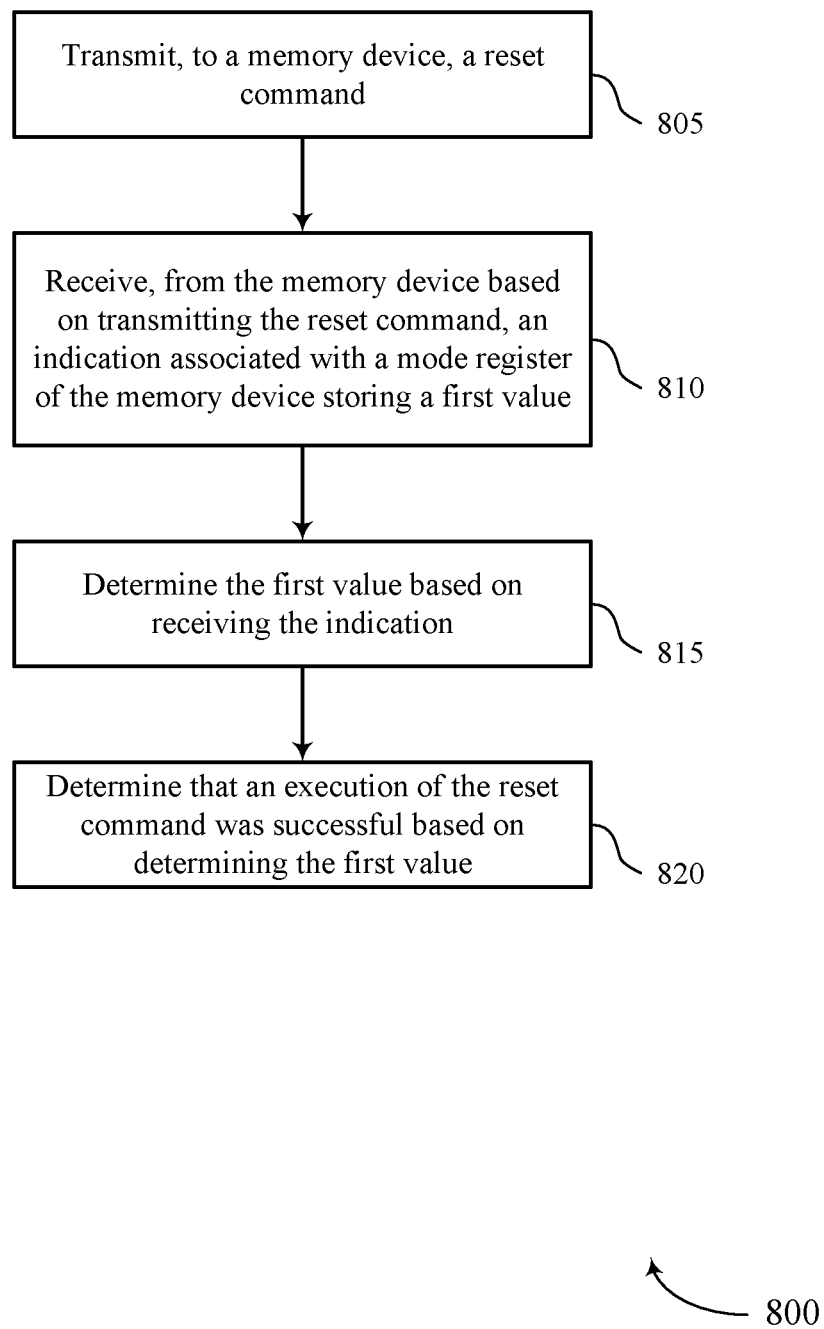

FIG. 8 shows a flowchart illustrating a method or methods 800 that supports reset verification in a memory system in accordance with aspects of the present disclosure. The operations of method 800 may be implemented by a host device or its components as described herein. For example, the operations of method 800 may be performed by a host device as described with reference to FIG. 5. In some examples, a host device may execute a set of instructions to control the functional elements of the host device to perform the described functions. Additionally or alternatively, a host device may perform aspects of the described functions using special-purpose hardware.

At 805, the host device may transmit, to a memory device, a reset command. The operations of 805 may be performed according to the methods described herein. In some examples, aspects of the operations of 805 may be performed by a command transmitter as described with reference to FIG. 5.

At 810, the host device may receive, from the memory device based on transmitting the reset command, an indication associated with a mode register of the memory device storing a first value. The operations of 810 may be performed according to the methods described herein. In some examples, aspects of the operations of 810 may be performed by a reception manager as described with reference to FIG. 5.

At 815, the host device may determine the first value based on receiving the indication. The operations of 815 may be performed according to the methods described herein. In some examples, aspects of the operations of 815 may be performed by a value manager as described with reference to FIG. 5.

At 820, the host device may determine that an execution of the reset command was successful based on determining the first value. The operations of 820 may be performed according to the methods described herein. In some examples, aspects of the operations of 820 may be performed by an execution command manager as described with reference to FIG. 5.

In some examples, an apparatus as described herein may perform a method or methods, such as the method 800. The apparatus may include features, means, or instructions (e.g., a non-transitory computer-readable medium storing instructions executable by a processor) for transmitting, to a memory device, a reset command, receiving, from the memory device based on transmitting the reset command, an indication associated with a mode register of the memory device storing a first value, determining the first value based on receiving the indication, and determining that an execution of the reset command was successful based on determining the first value.

Some examples of the method 800 and the apparatus described herein may further include operations, features, means, or instructions for comparing the first value with a second value indicating a second operation mode of the memory device different than a first operation mode of the memory device associated with executing the reset command, and determining that the first value may be associated with the first operation mode and may be different than the second value based on the comparing, where determining that the execution of the reset command was successful may be based on determining that the first value and the second value may be different.

Some examples of the method 800 and the apparatus described herein may further include operations, features, means, or instructions for transmitting, to the memory device, a command to set the mode register to the second value after determining that the execution of the reset command was successful.

Some instances of the method 800 and the apparatus described herein may further include operations, features, means, or instructions for determining the mode register from a set of mode registers based on receiving the indication, where determining the first value may be based on determining the mode register.

Some cases of the method 800 and the apparatus described herein may further include operations, features, means, or instructions for transmitting, to the memory device, a read command for the mode register based on the completion of performing the reset operation at the memory device, and receiving the first value from the memory device based on transmitting the read command, where determining the first value may be based on receiving the first value from the memory device.

In some instances of the method 800 and the apparatus described herein, the indication includes the first value, and determining the first value may be based on the indication including the first value.

Some examples of the method 800 and the apparatus described herein may further include operations, features, means, or instructions for transmitting a second reset command to the memory device, receiving, from the memory device, a second indication based on transmitting the second reset command, the second indication associated with the mode register of the memory device storing a second value, determining that the second value may be different than the first value based on receiving the second indication, the first value associated with a first operation mode of the memory device associated with executing the second reset command, and determining that an execution of the second reset command was unsuccessful based on determining that the second value may be different than the first value.

Figure 9:
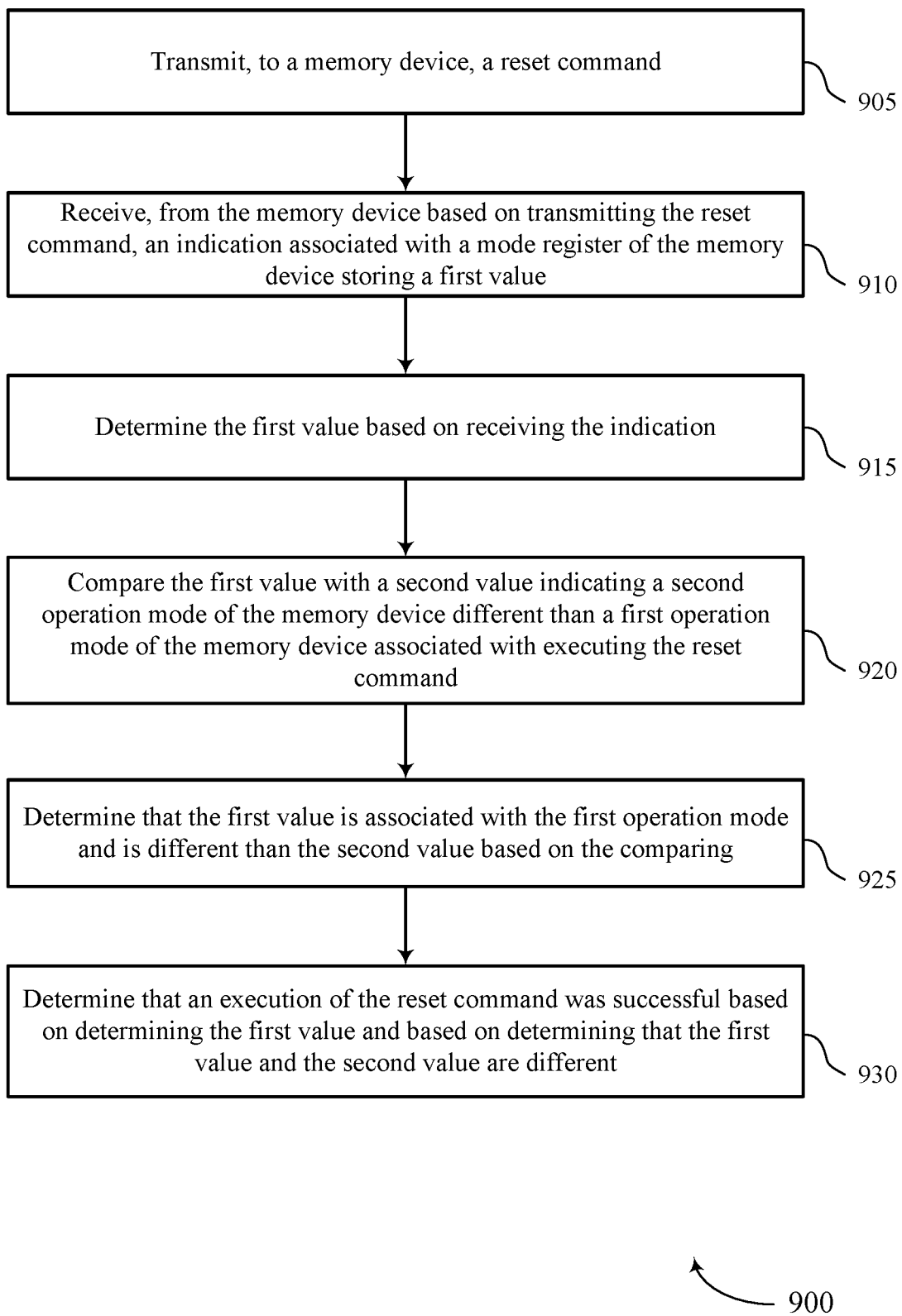

FIG. 9 shows a flowchart illustrating a method or methods 900 that supports reset verification in a memory system in accordance with aspects of the present disclosure. The operations of method 900 may be implemented by a host device or its components as described herein. For example, the operations of method 900 may be performed by a host device as described with reference to FIG. 5. In some examples, a host device may execute a set of instructions to control the functional elements of the host device to perform the described functions. Additionally or alternatively, a host device may perform aspects of the described functions using special-purpose hardware.

At 905, the host device may transmit, to a memory device, a reset command. The operations of 905 may be performed according to the methods described herein. In some examples, aspects of the operations of 905 may be performed by a command transmitter as described with reference to FIG. 5.

At 910, the host device may receive, from the memory device based on transmitting the reset command, an indication associated with a mode register of the memory device storing a first value. The operations of 910 may be performed according to the methods described herein. In some examples, aspects of the operations of 910 may be performed by a reception manager as described with reference to FIG. 5.

At 915, the host device may determine the first value based on receiving the indication. The operations of 915 may be performed according to the methods described herein. In some examples, aspects of the operations of 915 may be performed by a value manager as described with reference to FIG. 5.

At 920, the host device may compare the first value with a second value indicating a second operation mode of the memory device different than a first operation mode of the memory device associated with executing the reset command. The operations of 920 may be performed according to the methods described herein. In some examples, aspects of the operations of 920 may be performed by a value manager as described with reference to FIG. 5.

At 925, the host device may determine that the first value is associated with the first operation mode and is different than the second value based on the comparing. The operations of 925 may be performed according to the methods described herein. In some examples, aspects of the operations of 925 may be performed by a value manager as described with reference to FIG. 5.

At 930, the host device may determine that an execution of the reset command was successful based on determining the first value and based on determining that the first value and the second value are different. The operations of 930 may be performed according to the methods described herein. In some examples, aspects of the operations of 930 may be performed by an execution command manager as described with reference to FIG. 5.

Figure 10:
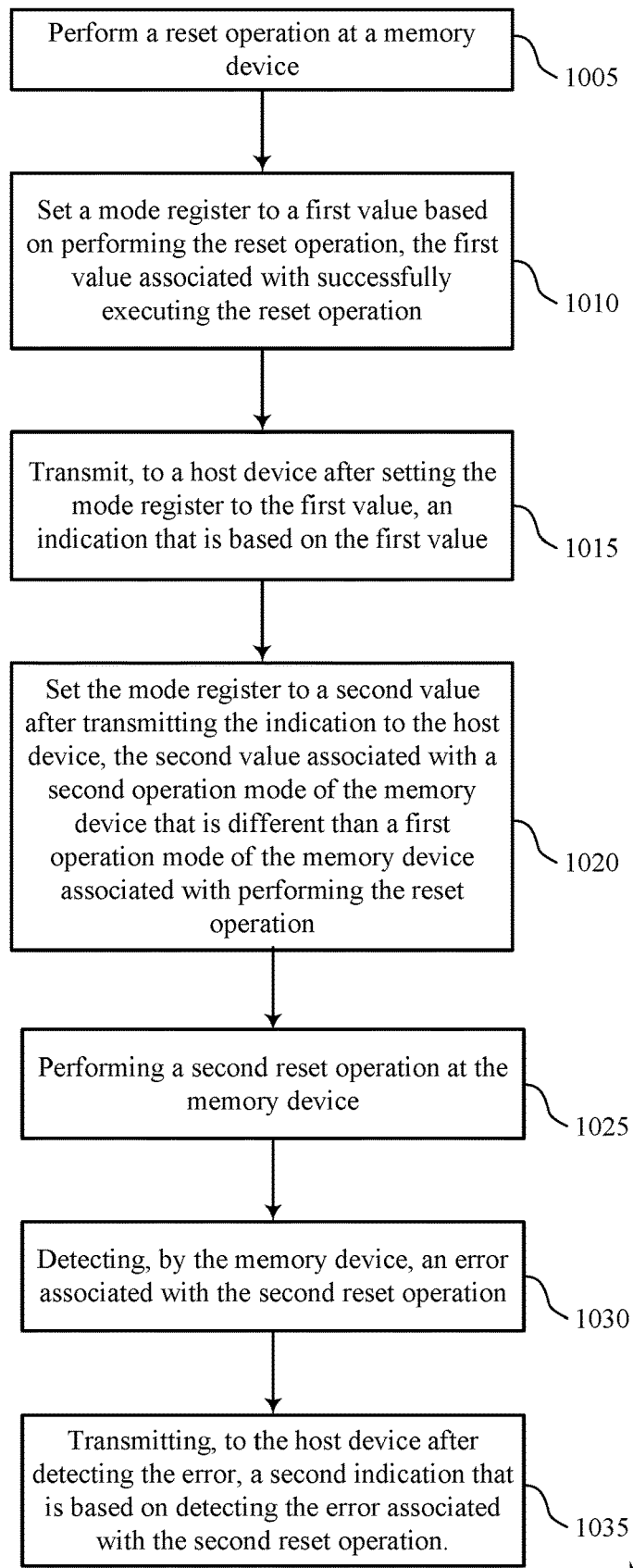

FIG. 10 shows a flowchart illustrating a method or methods 1000 that supports reset verification in a memory system in accordance with aspects of the present disclosure. The operations of method 1000 may be implemented by a host device or its components as described herein. For example, the operations of method 1000 may be performed by a host device as described with reference to FIG. 5. In some examples, a host device may execute a set of instructions to control the functional elements of the host device to perform the described functions. Additionally or alternatively, a host device may perform aspects of the described functions using special-purpose hardware.

At 1005, the memory device may perform a reset operation. The operations of 1005 may be performed according to the methods described herein. In some examples, aspects of the operations of 1005 may be performed by a reset manager as described with reference to FIG. 4.

At 1010, the memory device may set a mode register to a first value based on performing the reset operation, the first value associated with successfully executing the reset operation. The operations of 1010 may be performed according to the methods described herein. In some examples, aspects of the operations of 1010 may be performed by a mode register manager as described with reference to FIG. 4.

At 1015, the memory device may transmit, to the host device after setting the mode register to the first value, an indication that is based on the first value. The operations of 1015 may be performed according to the methods described herein. In some examples, aspects of the operations of 1015 may be performed by a transmission manager as described with reference to FIG. 4.

At 1020, the memory device may set the mode register to a second value after transmitting the indication to the host device, the second value associated with a second operation mode of the memory device that is different than a first operation mode of the memory device associated with performing the reset operation. The operations of 1020 may be performed according to the methods described herein. In some examples, aspects of the operations of 1020 may be performed by a mode register manager as described with reference to FIG. 4.

At 1025, memory device may perform a second reset operation. The operations of 1025 may be performed according to the methods described herein. In some examples, aspects of the operations of 1025 may be performed by a reset manager as described with reference to FIG. 4.

At 1030, the memory device may detect an error associated with the second reset operation. The operations of 1030 may be performed according to the methods described herein. In some examples, aspects of the operations of 1030 may be performed by error manager as described with reference to FIG. 4.

At 1035, the memory device may transmit, to the host device after detecting the error, a second indication that is based on detecting the error associated with the second reset operation. The operations of 1035 may be performed according to the methods described herein. In some examples, aspects of the operations of 1035 may be performed by a transmissions manager as described with reference to FIG. 4.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an interface for receiving, from a host device, a reset command for performing a reset operation at the apparatus, circuitry for detecting a successful performance of the reset operation performed based on receiving the reset command, and a controller coupled with the interface and the circuitry and operable to cause the apparatus to generate an indication of the successful performance of the reset operation based on the circuitry detecting the successful performance of the reset operation and communicate the indication to the interface, where the interface transmits the indication to the host device.

In some examples, the mode register may be operable to store a first value associated with successfully executing the reset operation; or store a second value associated with a second operation mode of the apparatus that may be different than a first operation mode of the apparatus associated with performing the reset operation.

In some instances, the controller may be further operable to set the mode register to the first value based on performing the reset operation, where the indication may be based on the first value, and set the mode register to the second value after transmitting the indication to the host device.

In some cases, the interface includes a pin dedicated to transmitting the indication from the apparatus to the host device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   performing a reset operation at a memory device;
   determining, based at least in part on performing the reset operation, whether to set a mode register to a first value indicating a successful execution of the reset operation or to a second value indicating an error associated with executing the reset operation;
   setting the mode register to the second value based at least in part on detecting the error associated with executing the reset operation; and
   transmitting, to a host device after setting the mode register to the second value, an indication that the reset operation is unsuccessful based at least in part on the second value.

2. A method, comprising:
   performing a reset operation at a memory device;
   determining, based at least in part on performing the reset operation, whether to set a mode register to a first value indicating a successful execution of the reset operation or to a second value indicating an error associated with executing the reset operation;
setting the mode register to the second value based at least in part on detecting the error associated with executing the reset operation;
transmitting, to a host device after setting the mode register to the second value, an indication that is based at least in part on the second value; and
setting the mode register to a third value after transmitting the indication to the host device, the third value associated with a second operation mode of the memory device that is different than a first operation mode of the memory device associated with performing the reset operation.

3. The method of claim 2, further comprising:
receiving, from the host device, a command to set the mode register to the third value, wherein setting the mode register to the third value is based at least in part on receiving the command from the host device.

4. The method of claim 2, wherein the third value is the same as the second value or different than both the first value and the second value.

5. The method of claim 2, wherein the second operation mode of the memory device is associated with performing a read operation, or a write operation, or both.

6. The method of claim 1, further comprising:
receiving, from the host device, a read command for the mode register based at least in part on transmitting the indication, wherein transmitting the indication further comprises:
transmitting the second value to the host device based at least in part on receiving the read command.

7. The method of claim 1, wherein an amount of time between successfully executing the reset operation and transmitting the indication to the host device is greater than or equal to a time delay defined for performing the reset operation.

8. The method of claim 1, further comprising:
performing a second reset operation at the memory device;
detecting, by the memory device, a successful execution of the second reset operation;
setting the mode register to the first value based at least in part on detecting the successful execution of the second reset operation; and
transmitting, to the host device after setting the mode register to the first value, a second indication of the successful execution of the second reset operation.

9. The method of claim 8, further comprising:
receiving, from the host device, a read command for the mode register based at least in part on transmitting the second indication, wherein transmitting the second indication further comprises:
transmitting the first value stored at the mode register based at least in part on receiving the read command, wherein the first value is different than the second value and indicates the successful execution of the second reset operation.

10. The method of claim 1, further comprising:
transmitting the indication to the host device by a pin that is dedicated to transmitting indications associated with performing reset operations.

11. A method, comprising:
transmitting, to a memory device, a reset command to perform a reset operation;
receiving, from the memory device based at least in part on transmitting the reset command, an indication that the reset operation is unsuccessful, the indication associated with a mode register of the memory device storing a value;
determining, based at least in part on receiving the indication, whether the stored value is a first value indicating a successful execution of the reset operation or a second value indicating an error associated with executing the reset operation; and
determining that an execution of the reset command was unsuccessful based at least in part on determining that the stored value is the second value.

12. A method, comprising:
transmitting, to a memory device, a reset command to perform a reset operation;
receiving, from the memory device based at least in part on transmitting the reset command, an indication associated with a mode register of the memory device storing a value:
determining, based at least in part on receiving the indication, whether the stored value is a first value indicating a successful execution of the reset operation or a second value indicating an error associated with executing the reset operation;
comparing the second value with a third value indicating a second operation mode of the memory device that is different than a first operation mode of the memory device associated with executing the reset command;
determining that the second value is associated with the second operation mode and is the same as the third value based at least in part on the comparing; and
determining that an execution of the reset command was unsuccessful based at least in part on determining that the stored value is the second value and that the second value and the third value are the same.

13. The method of claim 11, further comprising:
determining the mode register from a plurality of mode registers based at least in part on receiving the indication, wherein determining whether the stored value is the first value or the second value is based at least in part on determining the mode register.

14. The method of claim 11, further comprising:
transmitting, to the memory device, a read command for the mode register based at least in part on receiving the indication from the memory device; and
receiving the stored value from the memory device based at least in part on transmitting the read command, wherein determining whether the stored value is the first value or the second value is based at least in part on receiving the stored value from the memory device.

15. The method of claim 11, wherein:
the indication comprises the second value; and
determining whether the stored value is the first value or the second value is based at least in part on the indication comprising the second value.

16. A memory system, comprising:
an interface for receiving, from a host device, a reset command for performing a reset operation at the memory system,
circuitry for detecting a successful performance of the reset operation performed based at least in part on receiving the reset command,
a mode register operable to:
store a first value indicating a successful execution of the reset operation, or
store a second value indicating an error associated with executing the reset operation; and one or more controllers coupled with the interface and the circuitry and operable to cause the memory system to:
  determine whether to set the mode register to the first value or the second value;
  set the mode register to the second value based at least in part on the circuitry failing to detect the successful performance of the reset operation;
  generate an indication that the reset operation is unsuccessful based at least in part on setting to mode register to the second value; and
  communicate the indication to the interface, wherein the interface transmits the indication to the host device.

17. A memory system comprising:
an interface for receiving, from a host device, a reset command for performing a reset operation at the memory system,
circuitry for detecting a successful performance of the reset operation performed based at least in part on receiving the reset command,
a mode register operable to:
  store a first value indicating a successful execution of the reset operation, or
  store a second value indicating an error associated with executing the reset operation, or
  store a third value associated with a second operation mode of the memory system that is different than a first operation mode of the memory system associated with performing the reset operation; and
one or more comtrollers coupled with the interface and the circuitry and operable to cause the memory system to:
  determine whether to set the mode register to the first value or the second value;
  set the mode register to the second value based at least in part on the circuitry failing to detect the successful performance of the reset operation;
  generate an indication of an error associated with executing the reset operation based at least in part on setting to mode register to the second value; and
  communicate the indication to the interface, wherein the interface transmits the indication to the host device.

18. The memory system of claim 17, wherein the third value is the same as the second value or different than both the first value and the second value.

19. The memory system of claim 17, wherein the second operation mode of the memory system is associated with performing a read operation, or a write operation, or both.

20. The memory system of claim 16, wherein the interface comprises a pin dedicated to transmitting the indication from the memory system to the host device.

* * * * *